(12) United States Patent
Mankos (10) Patent No.: US 8,258,474 B1
(45) Date of Patent: Sep. 4, 2012

(54) COMPACT ARRANGEMENT FOR DUAL-BEAM LOW ENERGY ELECTRON MICROSCOPE

(75) Inventor: Marian Mankos, Palo Alto, CA (US)

(73) Assignee: Electron Optica, Inc., Palo Alto, CA (US)

( * ) Notice: Subject to any disclaimer, the term of this patent is extended or adjusted under 35 U.S.C. 154(b) by 46 days.

(21) Appl. No.: 13/071,412

(22) Filed: Mar. 24, 2011

(51) Int. Cl.
*H01J 37/26* (2006.01)
(52) U.S. Cl. ......... 250/310; 250/306; 250/307; 250/311
(58) Field of Classification Search .................. 250/306, 250/307, 310, 311
See application file for complete search history.

(56) References Cited

U.S. PATENT DOCUMENTS

| | | | |
|---|---|---|---|
| 6,803,571 | B1 | 10/2004 | Mankos et al. |
| 6,803,572 | B2 | 10/2004 | Veneklasen et al. |
| 6,878,937 | B1 | 4/2005 | Mankos |
| 7,217,924 | B1 | 5/2007 | Mankos et al. |
| 7,838,832 | B1 * | 11/2010 | Mankos et al. ............... 250/310 |

* cited by examiner

*Primary Examiner* — Michael Maskell (57) ABSTRACT

One embodiment relates to an apparatus for generating two spatially overlapping electron beams on a specimen. A first electron beam source is configured to generate a low-energy electron beam, and an energy-dispersive device bends the low-energy electron beam towards an semitransparent electron mirror. The semitransparent electron mirror is biased to reflect the low-energy electron beam. A second electron beam source is configured to generate a high-energy electron beam that passes through an opening in the semitransparent electron mirror. Both the low- and high-energy electron beams enter the same energy-dispersive device that bends both beams towards the specimen. A deflection system positioned between the high-energy electron source and semitransparent electron mirror is configured to deflect the high-energy electron beam by an angle that compensates for the difference in bending angles between the low- and high-energy electron beams introduced by the energy-dispersive device. Other embodiments are also disclosed.

17 Claims, 8 Drawing Sheets

Prior Art

Prior Art

Prior Art

COMPACT ARRANGEMENT FOR DUAL-BEAM LOW ENERGY ELECTRON MICROSCOPE

BACKGROUND OF THE INVENTION

1. Field of the Invention

The present invention relates generally to electron beam apparatus and electron microscopy methods.

2. Description of the Background Art

Optical microscopes, the simplest and most used instruments used to image objects too small for the naked eye to see, uses photons with visible wavelengths for imaging. The specimen is illuminated with a broad light beam, and a magnified image of the specimen can be observed using an eyepiece or camera. The maximum magnification of a light microscope can be more than 1000× with a diffraction-limited resolution limit of a few hundred nanometers. Improved spatial resolution in a optical microscope can be achieved when shorter wavelengths of light, such as the ultraviolet, are utilized for imaging.

An electron microscope is a type of microscope that uses electrons to illuminate the specimen and create a magnified image of it. The microscope has a greater resolving power than a light microscope, because it uses electrons that have wavelengths few orders of magnitude shorter than visible light, and can achieve magnifications exceeding 1,000,000×.

Scanning electron beam microscopes, the most widely used electron microscopes, image the sample surface by scanning it with a tightly focused high-energy beam of electrons in a raster scan pattern, pixel by pixel. In a typical SEM, an electron beam is emitted in a vacuum chamber from an electron gun equipped with a thermionic (tungsten, lanthanum hexaboride), thermally assisted (Schottky, zirconium oxide) or cold field emission cathode. The electron beam, which typically has an energy ranging from a few hundred eV to few tens keV, is collimated by one or more condenser lenses and then focused by the final objective lens to a spot about 1 nm to 100 nm in diameter. The beam is deflected by pairs of magnetic scanning coils or electrostatic deflector plates, sweeping in a raster fashion over a rectangular area of the specimen surface. When the primary electron beam strikes the sample, the electrons deposit energy in a teardrop-shaped volume of the specimen known as the interaction volume, which extends from less than few nm to few μm into the surface, depending on the electron's landing energy and the composition of the specimen. Primary electrons can generate elastically scattered electrons, secondary electrons due to inelastic scattering, characteristic Auger electrons and the emission of electromagnetic radiation. Each of the generated signals can be detected by specialized detectors, amplified and displayed on a CRT display or captured digitally, pixel by pixel on a computer.

Low energy emission microscopes (LEEM) are projection (as opposed to scanning) electron microscopes, and thus resemble a conventional light microscope. In a LEEM, the electron gun forms a broad electron beam that is accelerated to typically 10 to 30 keV and passed through a magnetic prism separator, an energy-dispersive device that separates the illumination and projection optics and bends the beam into the axis of the objective lens containing the specimen. A parallel flood beam then uniformly illuminates the specimen that is electrically biased at approximately the same potential as the cathode of the electron gun, so that illuminating electrons are decelerated in the objective lens, striking the specimen at energies typically between 0 to about 1000 eV. In the opposite direction, i.e. upward from the specimen, the objective lens simultaneously forms a magnified image of the specimen. As the electrons reenter the prism separator, they get bent into the projection optics. The projection zoom optics forms an electron image on the scintillating screen that is then viewed by a CCD camera and further processed on a computer.

LEEM is a powerful parallel imaging technique that provides information about the topmost atomic layer, and is thus ideally suited for the characterization of surface properties. However, when a conventional LEEM instrument is used to image insulating specimens, the low landing energy exacerbates charging effects resulting in significantly reduced image quality. The imbalance between the arriving and leaving flux of electrons causes the surface to charge up, resulting in increased blur and distortions. In many cases, the built-up surface charge can rapidly discharge in an arc, resulting in specimen damage. On a homogeneous insulator surface, the charging can be suppressed by operating at a landing energy resulting in a net electron yield of 1. However, this approach restricts the landing energy and typically does not work when different insulating materials are present on the surface. Effective means for controlling local surface charging are therefore desirable if LEEM instruments are to be used for imaging of insulating samples.

The dual illumination beam approach is a practical solution to this problem. In a dual-beam LEEM, two electron beams with different landing energies are used to mitigate the charging effect. When an insulating specimen is illuminated with a low-energy electron beam with landing energy near 0 eV, a fraction of electrons is mirrored and the remainder is absorbed, charging the surface negatively. When a high-energy electron beam (~100 eV or more) is used for illumination, secondary electrons are emitted and the electron yield can exceed 1, charging the surface positively. However, when two beams with opposite charging characteristics, i.e. a low-energy mirror electron beam and a high-energy electron beam are superimposed on the specimen, charging effects can be neutralized. The challenge is to devise an electron optical system that can deliver overlapping illumination of the low-energy mirror and high-energy electron beams at preferably normal incidence on the specimen, i.e. a system that combines two parallel electron beams with different energies and beam currents at the specimen surface.

SUMMARY

One embodiment pertains to an apparatus for generating two spatially overlapping electron beams on a specimen. A first electron beam source is configured to generate a low-energy electron beam, and an energy-dispersive device bends the low-energy electron beam towards a semitransparent electron mirror. The semitransparent electron mirror is biased to reflect the low-energy electron beam. A second electron beam source is configured to generate a high-energy electron beam that passes through an opening in the semitransparent electron mirror. Both the low- and high-energy electron beams enter the same energy-dispersive device that bends both beams towards the specimen. A deflection system positioned between the high-energy electron source and semitransparent electron mirror is configured to deflect the high-energy electron beam in the beam bending plane by an angle that compensates for the difference in bending angles between the low- and high-energy electron beams introduced by the energy-dispersive device, therein allowing both the low- and high-energy beams to strike the specimen at normal incidence.

Another embodiment pertains to a method for generating two spatially overlapping electron beams on a specimen. A low-energy electron beam is generated and bent by an energy-dispersive device that bends the low-energy beam towards a semitransparent electron mirror. The semitransparent electron mirror reflects the low-energy beam back towards the energy-dispersive device. A high-energy electron beam is generated and pre-deflected by an angle that compensates for the difference in bending angles between the low- and high-energy electron beams introduced by the energy-dispersive device. The high-energy electron beam passes through the semitransparent electron mirror and is transported to the energy-dispersive device. Both the low- and high-energy electron beams are bent by the energy-dispersive device towards the specimen and strike the specimen at normal incidence.

Other embodiments are also disclosed.

DETAILED DESCRIPTION

Dual Beam Illumination Using Two Electron Guns with Inclined Axes

One approach to combine two illuminating electron beams with different charging characteristics to mitigate the deleterious charging effects is disclosed in U.S. Pat. No. 6,803,572, which is entitled "Apparatus and methods for secondary electron emission with a dual beam" and which issued Oct. 12, 2004 to inventors Lee H. Veneklasen and David L. Adler. This approach employs two electron guns that generate two illumination beams.

Figure 1:
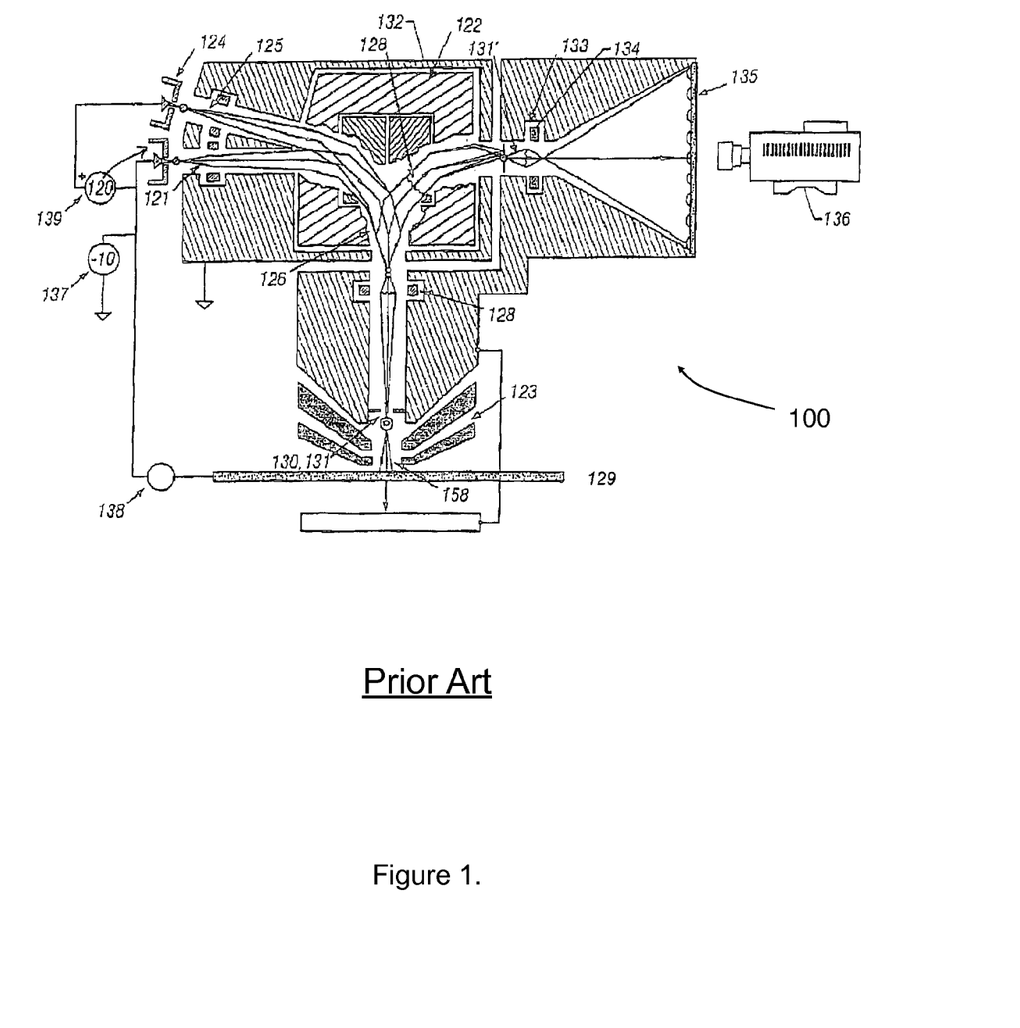
FIG. 1 is a diagram depicting a first prior structure for an electron beam apparatus having two illuminating beams.

FIG. 1 is a diagram depicting a structure for this first prior electron beam apparatus 100. In this prior apparatus 100, a first electron gun 120 generates a low energy beam 121, and a second electron gun 124 generates a higher energy beam 125. The low energy beam 121 generated by electron gun 120 passes through a magnetic prism separator 122, an energy-dispersive element composed of an array of uniform magnetic fields of different length and strength, which deflects low energy beam 121 by 90 degrees into the objective lens 123. The second gun 124 is located slightly above and behind the low energy gun 120. Since its energy is somewhat higher, the beam 125 from the second gun 124 is bent through a smaller angle in the prism separator 122, allowing the two beam paths 126 to be superimposed where they enter the cathode lens 123. The objective lens 123 decelerates and collimates the two beams 121 and 125 to form coincident and parallel flood beams 158 that illuminate the specimen 129. Higher energy backscattered and secondary electrons, along with low energy reflected electrons, are re-accelerated and focused in the objective lens 123, passing back upwards through the prism separator 122, where they are bent into the projection system.

Figure 2:
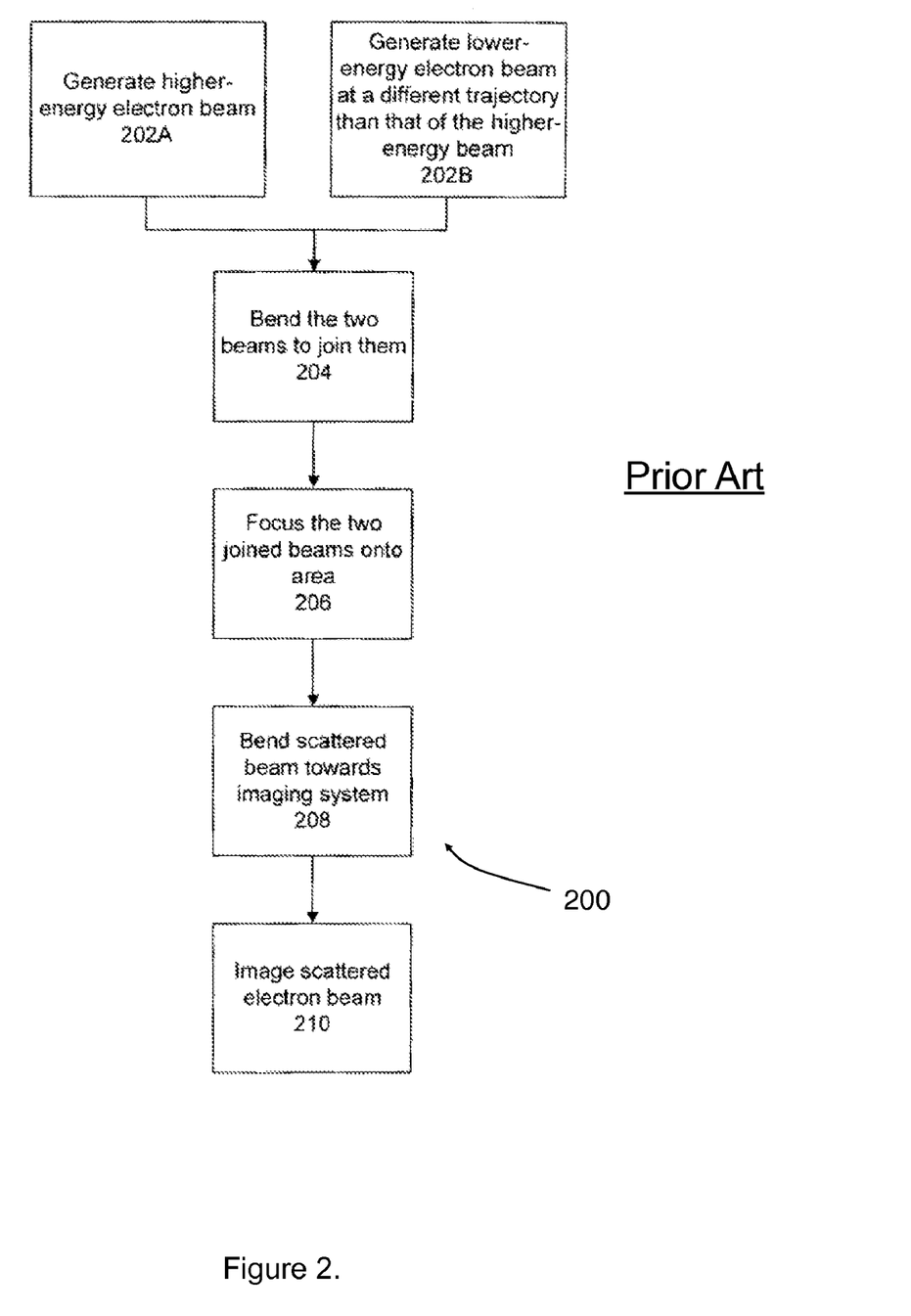
FIG. 2 is a flow chart depicting a first prior method for imaging of a specimen using two illuminating beams.

FIG. 2 is a flow chart depicting a first prior method 200 for imaging a specimen using two illuminating beams. This prior method 200 may use the prior structure 100 described above in relation to FIG. 1.

A high-energy electron beam is generated 202A by a first electron gun. Separately, a low-energy beam is generated 202B by a different gun at a different trajectory. The two beams are bent 204 to join them. This is done by a magnetic prism separator bending the high-energy beam at less of an angle in comparison to its bending of the low-energy beam. As such, the two beams can be made to be superimposed upon each other. When the difference between the prism deflection angles equals the inclination angle of the two beams entering the prism separator, both beams coincide on the same specimen location and strike the specimen at normal incidence. Using the objective lens, the beams are then collimated and focused 206 to illuminate an area of the specimen.

Scattered electrons generated by the impingement of the beams onto the area are deflected 208 by the magnetic separator towards the projection system to separate them from the illumination electron beams. The separation occurs because, within the prism separator, the scattered electrons have velocity vectors away from the specimen, while the incident electrons have velocity vectors towards the specimen. Finally, the scattered electron beam is imaged 210 to view the illuminated area.

As describe above, the prior apparatus 100 and method 200 use two co-planar guns of different beam energies and inclined beam axes. The guns are configured such that the angle of inclination is equal to the difference in bending angles caused by the magnetic prism separator. However, this prior technique is disadvantageous in some aspects. The practical implementation of this approach is rather difficult, due to the small difference in deflection angles. For example, for a 30 keV electron beam energy and beam energy differential of 300 eV, the difference in deflection angles amounts to only about 5 mrad, i.e. about ⅓ of a degree. This means that the guns must be impractically far from the prism in order to not overlap. In principle, one can increase the angular separation by biasing a drift tube in the prism separator at high negative potential and thus lowering the beam energy while electrons pass through the prism. However this is not desirable due to increased Coulomb interactions and geometric aberrations that deteriorate the spatial resolution of electron beam apparatus 100. In addition, it complicates the design and increases the likelihood of high-voltage arcing. Even when the beam energy is lowered in the prism separator, the two electron guns must be implemented in close proximity to each other, which makes the design very difficult to implement. The method and apparatus described below overcomes these disadvantages.

Dual Beam Illumination Using Dual-Beam Electron Gun

Figure 3:
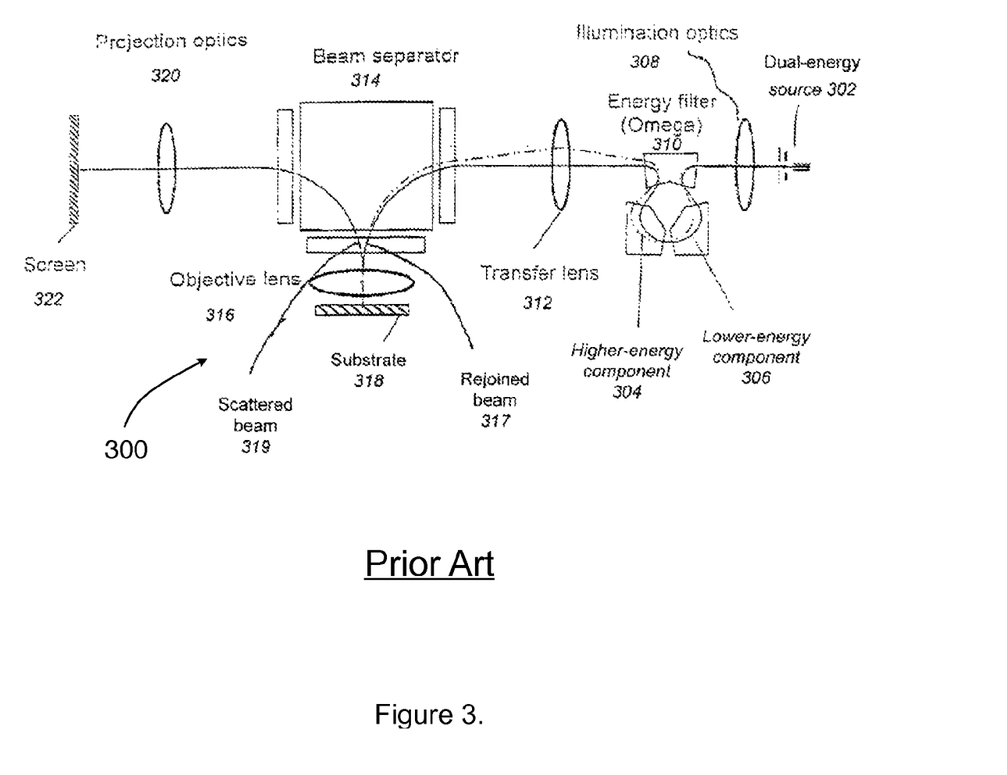
FIG. 3 is a diagram depicting a second prior structure for an electron beam apparatus having two illuminating beams.

FIG. 3 is a diagram depicting a second structure for an electron beam apparatus having two illuminating beams. This prior apparatus 300 is disclosed in U.S. Pat. No. 6,803,571, which is entitled "Method and Apparatus for Dual-Energy E-Beam Inspector," and which issued Oct. 12, 2004 to inventors Marian Mankos and David L. Adler.

Unlike the prior technique using two inclined beams discussed above in relation to FIGS. 1 and 2, the presently disclosed apparatus and method does not necessarily require biasing of the separator at high voltage in order to achieve sufficient angular separation of the low and high energy beams. In addition, the presently disclosed technique does not require two electron guns to be in close proximity to each other.

As shown in FIG. 3, the apparatus 300 includes a dual-beam electron gun 302 that is configured to generate both a high-energy electron beam component 304 and a low-energy electron beam component 306. In one implementation, the dual-beam electron gun 302 is composed of two concentric cathodes, an inner disc and an outer annulus. The inner disc may be biased at a high negative voltage with respect to the specimen, while the outer annulus may be biased by an additional negative voltage with respect to the inner disc. For example, the outer annulus may be biased at several hundred volts more negative than the inner disc.

The dual-energy beam emitted by the dual-beam electron gun 302 is collimated by illumination optics 308. After the illumination optics, the dual-energy beam enters an energy filter 310. The energy filter 310 operates as an energy-dispersive device. For example, the energy filter may comprise an omega (magnetic) type energy filter. Alternatively, it may comprise an alpha (magnetic) type energy filter. The energy filter 310 introduces dispersion between the low-energy and high-energy components of the electron beam, such that the two electron beam components exit the filter 310 at different angles of trajectory. As illustrated, the high-energy component 304 may exit the filter 310 inclined at an angle to the optical axis while the low-energy component 306 exits the filter 310 along the optical axis. In one implementation, the asymptotic object plane of the energy filter 310 is located at the exit plane of the illumination optics 308, and the energy filter 310 forms an asymptotic image that is then transferred into the object plane of the prism separator 314 using a transfer lens 312. The energy filter 310 may, for example, be configured to be operated in a unity magnification mode for ease of implementation.

The prism separator 314 is configured to receive the two dispersed electron beam components and bend the trajectories of the components. The trajectories are bent so as to substantially cancel the dispersion previously introduced by the energy filter 310. As a result, the two electron beam components are rejoined in trajectory as they exit the prism separator 314 and enter the objective lens 316 coaxially.

Because the dispersion previously introduced between the two components is relatively small, less deflection is needed within the beam separator 314 to converge the two components. In comparison, due to the use of two separate guns, greater deflection is needed within the beam separator 122 of the prior apparatus 100. Hence, the prism separator 314 may comprise a more conventional magnetic prism array. For example, the beam separator 314 may be implemented as a compact, double-focusing magnetic prism array composed of an array of uniform magnetic fields of different length and strength using pole pieces at ground potential, without the need for biasing it at a high negative potential. For example, see U.S. Pat. No. 6,878,937, "Prism Array for Electron Beam Inspection and Defect Review," issued Apr. 12, 2005 to inventor Marian Mankos.

The objective lens 316 decelerates and collimates the rejoined beam 317 onto an area of the specimen 318. The specimen 318 may be electrically biased at approximately the same voltage as one of the cathodes of the source 302, such that the illuminating electrons are decelerated prior to impinging upon the specimen 318. When the specimen surface is biased slightly more positive than the low-energy source cathode, impingement of each of the two e-beam components onto the area of the specimen 318 generates a scattered beam 319. The beam 319 includes reflected electrons from the low energy beam 306 and secondary and backscattered electrons generated by the higher energy beam 304. The low energy beam 304 charges the surface negatively, while the high energy beam 304 charges the sample positively, resulting in dynamic charge equilibrium at the surface. Higher energy backscattered and secondary electrons, along with low energy reflected electrons, are re-accelerated and focused in the objective lens 316, passing back upwards through the prism separator 314, where they are bent into the projection optics 320.

Figure 4:
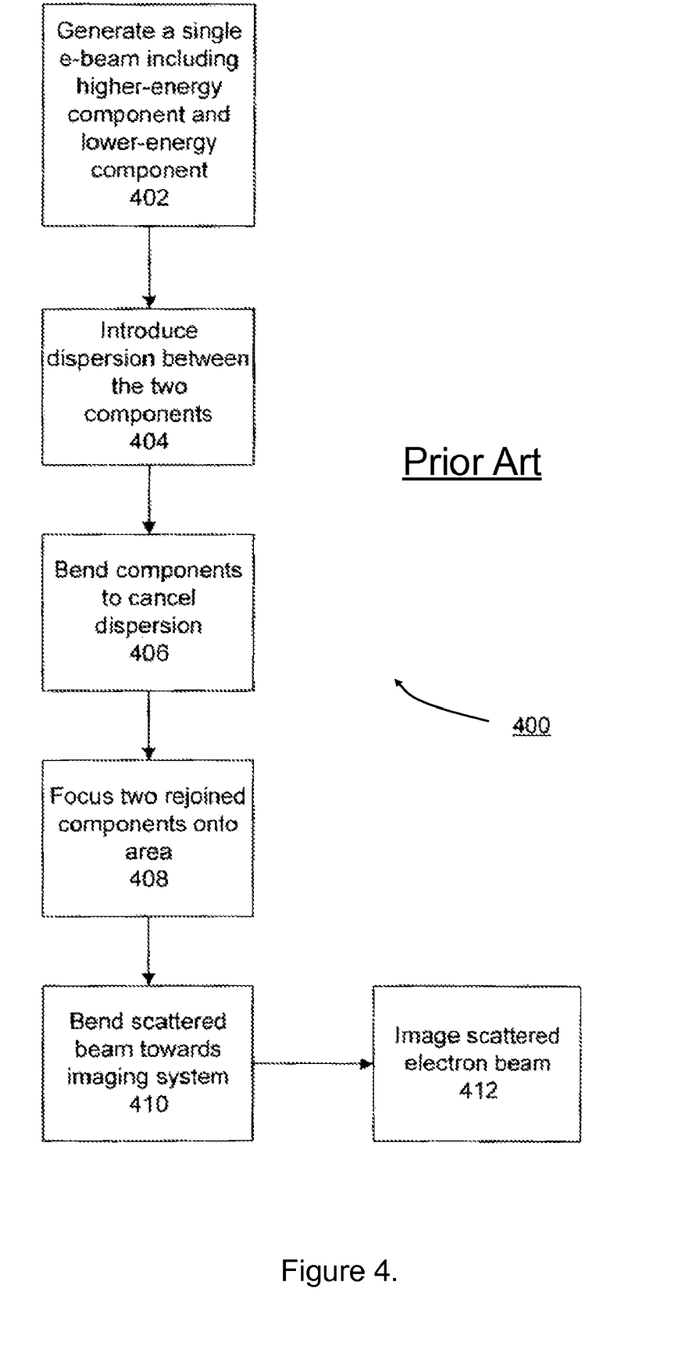
FIG. 4 is a flow chart depicting a second prior method for imaging of a specimen using two illuminating beams.

FIG. 4 is a flow chart depicting a second prior method 400 for imaging a specimen using two illuminating beams in accordance with an embodiment of the invention. This prior method 400 may use the prior structure 300 described above in relation to FIG. 3.

A single dual-energy electron beam is generated 402 by a dual-beam electron gun. The dual electron beam includes a high-energy electron beam component and a low-energy electron beam component. Both components have the same coaxial trajectory so that they make up a single beam.

Dispersion is then introduced 404 between the two beam components. The dispersion may be introduced by, for example, an energy filter. The two components enter the energy filter along the same trajectory, but they leave the energy filter with different angles of trajectory.

The two dispersed components are bent 406 to substantially cancel out the dispersion and rejoin the components into a single beam. This may be done by a prism separator bending the high-energy beam at slightly less of an angle in comparison to its bending of the low-energy beam. As such, the two components can be rejoined coaxially, i.e. superimposed upon each other at the specimen. Using the objective lens, the single beam composed of two rejoined components is decelerated, collimated and focused 408 onto an area of the specimen.

Impingement of the rejoined electron beam components onto the specimen area generates scattered electrons. The scattered electrons (whether backscattered electrons, secondary electrons, or reflected electrons) are bent 410 by the prism separator to separate them from the low and higher energy illumination electron beams. The scattered beam is deflected away from the illumination system and instead towards the projection system. The separation occurs because, within the magnetic separator, the scattered electrons have velocity vectors away from the specimen, while the incident electrons have velocity vectors towards the specimen. Finally, the scattered electron beam is imaged 412 to view the illuminated area.

However, this prior technique using a dual-beam electron gun is disadvantageous in some aspects. The proximity of the two cathodes in the gun at different temperatures and potentials results in complex crosstalk effects, beam current drift and long settling times, which makes it difficult for practical use and may reduce stability and reliability of the electron beam apparatus. These issues can be resolved when an electron mirror and prism are used to recombine two spatially separate electron beams.

Dual Beam Illumination Using Two Prisms and Electron Mirror

Figure 5:
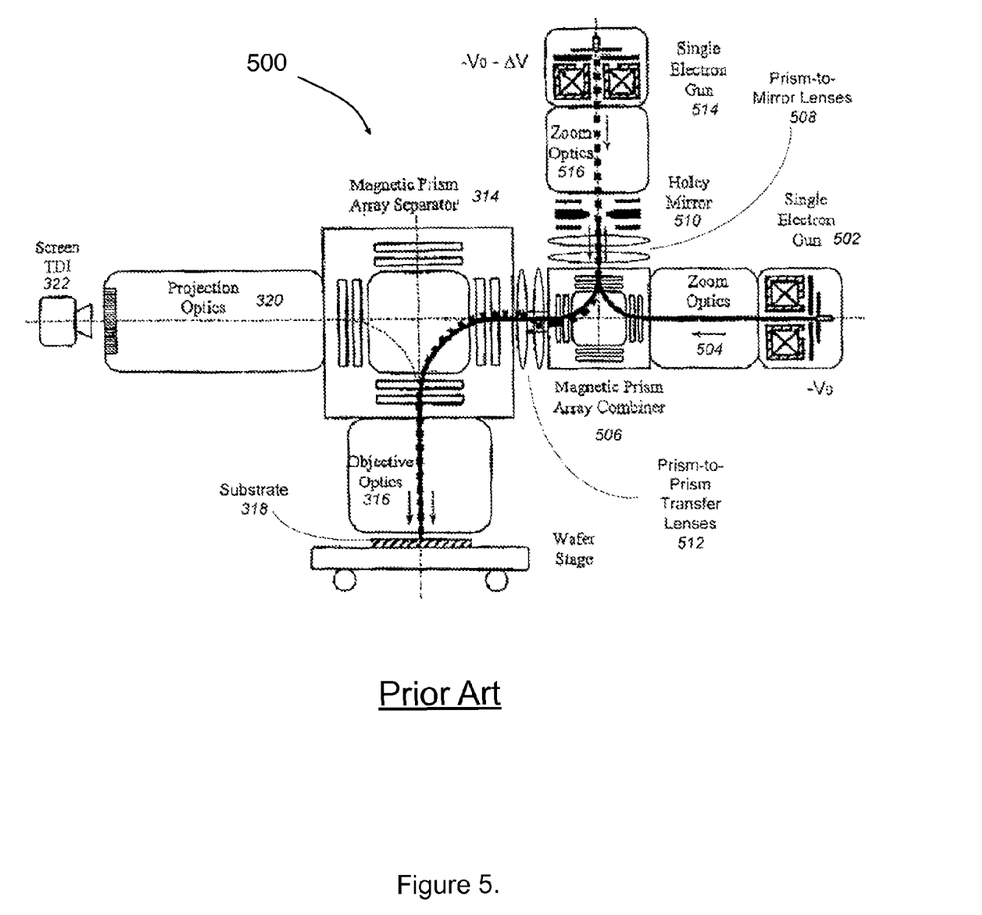
FIG. 5 is a diagram depicting a third prior structure for an electron beam apparatus having two illuminating beams.

FIG. 5 is a diagram depicting a third structure for an electron beam apparatus having two illuminating electron beams. This prior apparatus 500 is disclosed in U.S. Pat. No. 7,217,924, which is entitled "Method and Apparatus for Dual-Energy E-Beam Inspector," and which issued May 15, 2007 to inventors Marian Mankos and Eric Munro.

Unlike the prior technique using two inclined beams discussed above in relation to FIGS. 1 and 2, the presently disclosed apparatus and method does not necessarily require biasing of the separator at high voltage in order to achieve sufficient angular separation of the low and high energy beams. In addition, the presently disclosed technique does not require two electron guns to be in close proximity to each other.

Unlike the prior technique using a dual-beam gun discussed above in relation to FIGS. 3 and 4, the presently disclosed apparatus and method does not require the use of a relatively complex dual-beam gun.

FIG. 5 is a diagram depicting a structure for an electron beam apparatus 500 having two illuminating beams in accordance with an embodiment of the invention. Compared with the apparatus 300 of FIG. 3, the apparatus 500 of FIG. 5 includes a substantially modified illumination configuration with two perpendicular branches which are connected by a magnetic prism array combiner 506. The first branch includes a first electron gun or source 502 at a first (lower) potential energy U, along with zoom optics 504. The second branch includes a second electron gun or source 514 at a second (higher) potential energy U+dU, along with zoom optics 516. The second branch also includes an array-to-mirror lens configuration 508, and an electron mirror arrangement 510.

The magnetic prism array combiner 506 may be implemented as a compact, double focusing magnetic prism array which forms uniform magnetic fields of different strength and length, similar to the prism separator 314. For example, see U.S. Pat. No. 6,878,937, "Prism Array for Electron Beam Inspection and Defect Review," issued Apr. 12, 2005 to inventor Marian Mankos. The magnetic prism array combiner 506 is configured so as to make co-axial the two electron beams emitted from the two spatially separated beam guns (502 and 514).

The first electron gun 502 is biased at a high negative potential of $V_1 = -V_0$ so as to generate a first electron beam (solid line in FIG. 5) of relatively lower energy. As shown in FIG. 5, the first gun 502 may be located along the horizontal microscope axis formed by the illumination and projection optics. After the illumination zoom optics 504, the low-energy beam passes through the magnetic prism array combiner, which bends this beam by ninety degrees into the prism-to-mirror lenses 508 which focus the beam onto the semitransparent electron mirror arrangement 510.

The semitransparent electron mirror 510 may be implemented as an electrostatic lens or mirror which is biased slightly more negatively than the first gun 502. For example, the electron mirror 510 may be biased to be at $V_{mirror} = -V_0 - dV$. Because of the more negative bias of the semitransparent electron mirror 510 relative to the bias of the first gun 502, the semitransparent electron mirror 510 reflects or repels the first electron beam back through the prism-to-mirror lenses 508, so that the first electron beam re-enters the magnetic prism array combiner 506.

In addition, the second electron gun 514, positioned along the vertical axis of the prism array combiner 506, is biased more negatively than the semitransparent electron mirror 510 so as to generate a second electron beam (dashed line in FIG. 5) at relatively higher energy. In other words, the second electron gun 514 may be biased at a high negative voltage of $V_2 = -V_0 - \Delta V$, where $\Delta V$ is larger than dV. For example, $\Delta V$ may be a few hundred volts. Since the second electron gun 514 is biased more negatively than the semitransparent electron mirror 510, the second electron beam, after the zoom optics 516, passes through the hole or opening of the semitransparent electron mirror 510 and becomes co-axial with the first, lower energy beam. The second beam is injected into the magnetic prism array combiner 506 in a co-axial manner with respect to the first beam.

The magnetic prism array combiner 506 bends both the first and second electron beams by approximately ninety degrees so that their trajectories are back approximately along the horizontal microscope axis. However, because the second electron beam has a relatively higher energy and hence a relatively higher velocity than the first electron beam, the second electron beam (dashed line) is deflected less (i.e. is bent less) than the first electron beam (solid line) by the magnetic prism array combiner 506. For example, as shown in FIG. 5, the first beam (solid line, lower energy) may be deflected by 90 degrees to be parallel with the horizontal microscope axis while the second beam (dashed line, higher energy) may be deflected by slightly less than 90 degrees to be almost (but not quite) parallel to the horizontal microscope axis.

The prism-to-prism transfer lenses 512 are configured to change the trajectory of both electron beams before the beams enter the magnetic prism array separator (prism separator) 314. For example, as shown in FIG. 5, the trajectory of the second electron beam (dashed line, higher energy) may be changed so that the second electron beam enters the beam separator 314 at an inclined angle relative to the horizontal microscope axis.

The prism separator 314 may comprise, for example, a compact, double focusing magnetic prism array which provides uniform magnetic fields of different strength and length so as to provide a mechanism for stigmatic focusing and also enables the prism separator to behave as a round lens. The beam separator 314 may be configured to deflect the first and second electron beams such that they are co-axial after they emerge from the prism separator 314 (as they enter the objective optics 316). For example, as shown in FIG. 5, the first beam (solid line, lower energy) may be deflected by 90 degrees, and the second beam (dashed line, higher energy) may be deflected by slightly less than 90 degrees such that both beams end up with trajectories that are parallel with the vertical axis of the prism separator 314.

In a preferred embodiment, the prism array combiner 506 and the prism array separator 314 have identical or near identical dispersions. In addition, the prism-to-prism transfer lenses 512 preferably operate as a unity magnification transfer lens.

Thereafter, the apparatus 500 operates in a same or similar manner as the apparatus 300 discussed above in relation to FIG. 3. The angular difference in the trajectories of the first and second beams going into the prism separator 314 may be configured such that both beams exit the prism separator 314 (and enter the objective optics 316) at a same (co-axial) trajectory. After the beam is bent into the objective optics 316, the electrons are decelerated and focused by the objective lens. The electrons are scattered by the specimen 318, thus forming a two-dimensional image. This image from the scattered electrons is then refocused by the objective lens and deflected by the beam separator 314 into the projection optics 320, which magnifies the image for detection and display on a viewing screen. The detection may be performed by a TDI detector or other detection system.

Figure 6:
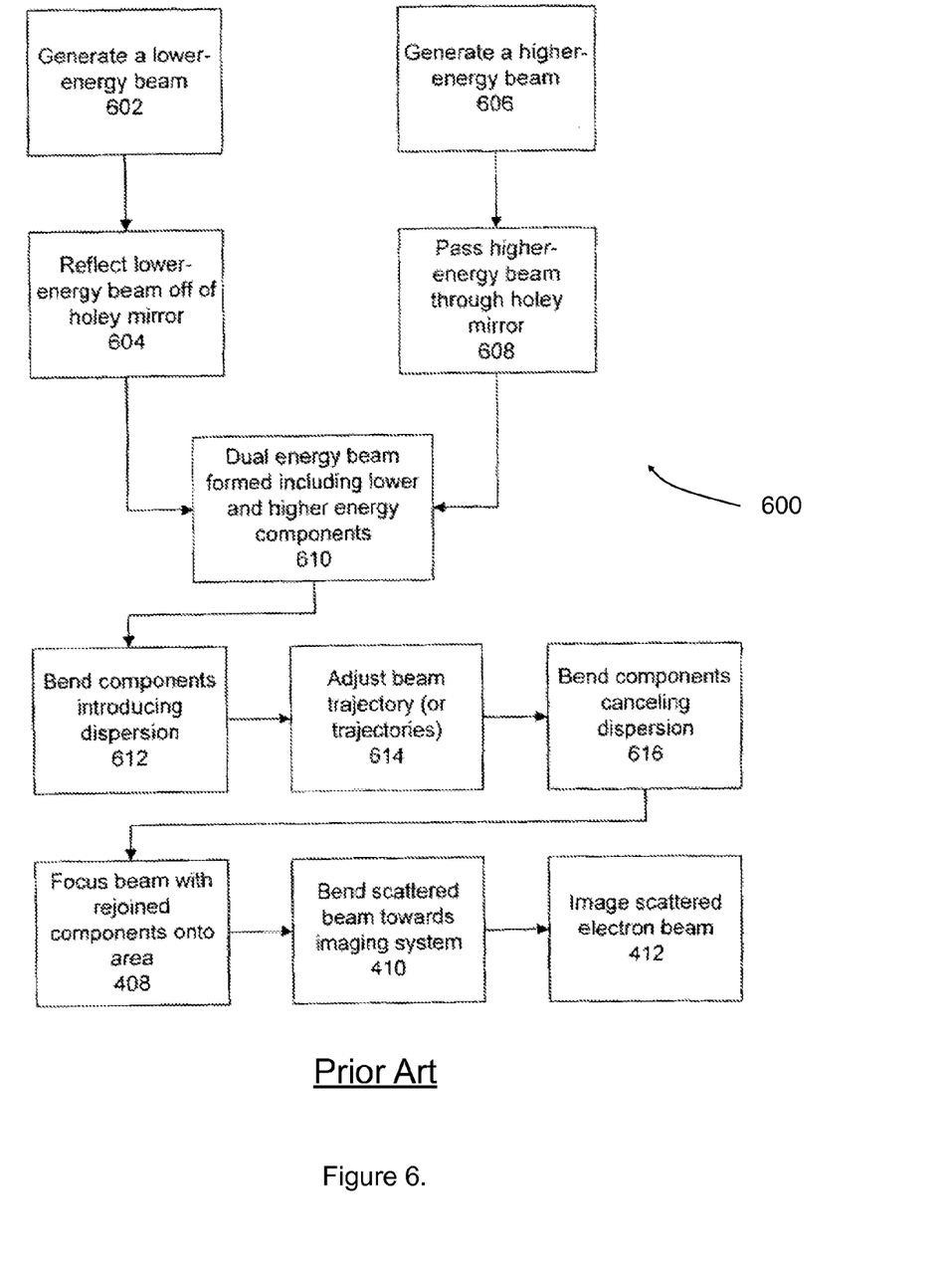
FIG. 6 is a flow chart depicting a third prior method for imaging of a specimen using two illuminating beams.

FIG. 6 is a flow chart depicting a method 600 for imaging of a specimen using two illuminating beams in accordance with an embodiment of the invention. This method 600 may use the structure 500 described above in relation to FIG. 5.

A low-energy electron beam is generated 602 by a first electron gun, and a high-energy electron beam is generated 606 by a second (separate) electron gun. The low-energy e-beam is reflected 604 off of the semitransparent electron mirror, while the high-energy e-beam is passed 608 through an opening in the semitransparent electron mirror. In this way, a dual-energy e-beam is formed 610 including lower and higher energy components.

The lower and higher energy components are bent 612 by the prism array combiner 506. During this bending 612, dispersion is introduced between the two beam components. In other words, the two components enter the prism array combiner 506 along the same trajectory, but they leave the prism array combiner 506 with different angles of trajectory.

A prism-to-prism transfer lens 512 may then be used to adjust 614 the trajectory of one or more of the beam components. Thereafter, the two dispersed components may be bent 616 to substantially cancel out the dispersion and rejoin the components into a single co-axial beam. This may be done by a prism separator 314 bending the high-energy beam at slightly less of an angle in comparison to its bending of the low-energy beam. As such, the two components can be rejoined coaxially (i.e. once again be superimposed upon each other).

Thereafter, the method 600 of FIG. 6 follows the same or similar steps as the method 400 described above in relation to FIG. 4. Using the objective lens, the single beam (with two rejoined high- and low-energy components) is then focused 408 (and decelerated and collimated) onto an area of the specimen. Impingement of the rejoined e-beam components onto the specimen area generates scattered electrons. The scattered electrons (whether backscattered electrons, secondary electrons, or reflected electrons) are bent 410 by the prism separator to separate them from the low and higher energy illumination electron beams. The scattered beam is deflected away from the illumination system and instead towards the projection system. The separation occurs because, within the separator, the scattered electrons have velocity vectors away from the specimen, while the incident electrons have velocity vectors towards the specimen. Finally, the scattered electron beam is imaged 412 to view the illuminated area.

This prior technique allows the use of two conventional single beam guns, which simplifies the gun design and makes the operation more reliable. However, this prior technique is disadvantageous in some aspects. A column with two beam-bending elements, i.e. a prism separator and prism combiner, becomes more complex and difficult to align, and the increased number of high precision components increases the cost. A simpler implementation with a single prism is thus desirable.

Dual Beam Illumination Using Single Prism and Electron Mirror

While the above discussed prior apparatus and methods provide dual-energy electron beams, improved apparatus and methods for providing dual-energy electron beams are desirable. One distinct technique for generating dual electron beam illumination using only a single prism separator and a semitransparent electron electron mirror is disclosed herein and discussed below.

Unlike the prior technique using two inclined beams discussed above in relation to FIGS. 1 and 2, the presently disclosed apparatus and method does not necessarily require biasing of the separator at high voltage in order to achieve sufficient angular separation of the low and high energy beams. In addition, the presently disclosed technique does not require two electron guns to be in close proximity to each other.

Unlike the prior technique using a dual-beam gun discussed above in relation to FIGS. 3 and 4, the presently disclosed apparatus and method does not require the use of a relatively complex dual-beam gun. Such a dual-beam gun may result in a complex gun design (for example, one having two concentric cathodes at different potentials and temperatures) which may reduce reliability and stability.

Unlike the prior technique using two conventional single beam guns, a prism combiner, a prism separator and an electron mirror, as discussed above in relation to FIGS. 5 and 6, the presently disclosed apparatus and method does not require the use of a prism combiner and the prism-to-prism transfer lenses. Such a design with a prism separator and prism combiner may result in increased complexity and alignment difficulties, which may reduce reliability and stability. The increased number of complicated electron-optical components such as a prism combiner and electron lenses also increases manufacturing costs.

Figure 7:
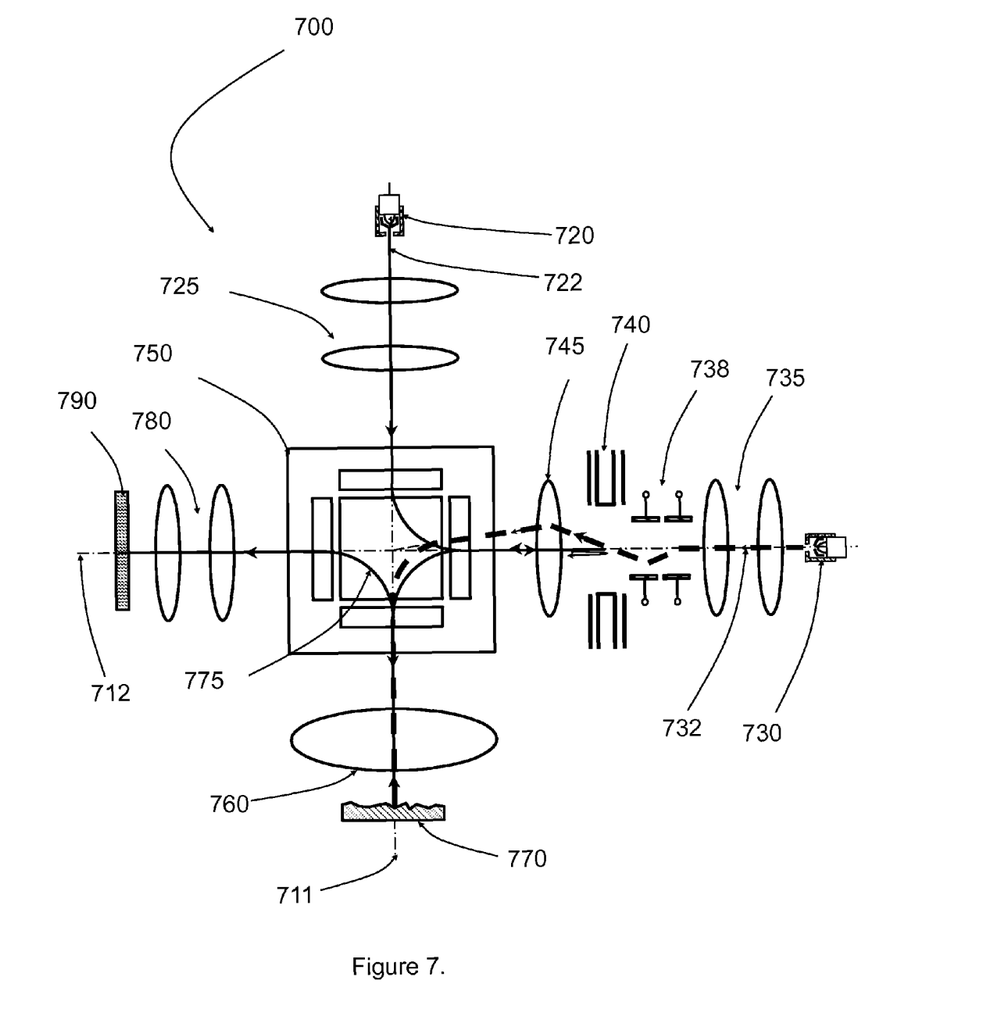
FIG. 7 is a diagram depicting a structure for an electron beam apparatus having two illuminating beams in accordance with an embodiment of the invention.

FIG. 7 is a diagram depicting a structure for an electron beam apparatus 700 having two illuminating beams in accordance with an embodiment of the invention. Such an apparatus 700 may be used to improve performance of electron beam systems when used for imaging of insulating or composite (metal, semiconductor, insulator) specimens.

In the single prism and semitransparent mirror design, the illumination optics has two perpendicular branches, which are recombined using only one prism array, i.e. the magnetic prism array separator 750, and a semitransparent electron mirror 740, as shown in FIG. 7. As in the previous approach, the semitransparent electron mirror is an electrostatic lens, which is biased slightly more negative than the low-energy electron gun 720 and slightly more positive than the high-energy electron gun 730, and thus reflects the low-energy electron beam 722 generated by low-energy electron gun 720 while transmitting the high-energy electron beam 732 generated by high-energy electron gun 730. Compared with the apparatus 500 of FIG. 5, the apparatus 700 of FIG. 7 does not include a prism combiner and prism-to-prism transfer lenses.

The illumination configuration of FIG. 7 includes two perpendicular branches which are joined by a magnetic prism array separator 750. The first branch includes a first electron gun 720 at a first (lower) potential energy U, along with condenser optics 725, positioned along the vertical axis 711 of the prism separator 750. The second branch includes a second electron gun 730 at a second (higher) potential energy U+dU, along with condenser optics 735, positioned along the horizontal axis 712 of the prism separator 750. The second branch also includes a transfer lens configuration 745, and a semitransparent electron mirror arrangement 740.

The magnetic prism separator 750 may be implemented as a compact, double focusing magnetic prism array with sections of uniform magnetic fields of different strength and length. For example, see U.S. Pat. No. 6,878,937, "Prism Array for Electron Beam Inspection and Defect Review," issued Apr. 12, 2005 to inventor Marian Mankos. The prism separator 750 is configured so as to make co-axial the two electron beams emitted from the two spatially separated electron guns (720 and 730).

The first electron gun 720 is biased at a high negative potential of $V_1=-V_0$ so as to generate a first electron beam 722 (solid line in FIG. 7) of relatively lower energy. As shown in FIG. 7, the first gun 720 may be located along the vertical microscope axis 711 formed by the objective lens 760. One or more condenser lenses 725 collimate the primary beam into the prism separator 750 that is configured to bend this beam by ninety degrees into the horizontal axis 712 defined by electron mirror 740. The semitransparent electron mirror 740 may be implemented as an electrostatic lens or mirror which is biased slightly more negatively than the first gun 720. For example, the electron mirror 740 may be biased to be at $V_{mirror}=-V_0-dV$ and thus reflects the low-energy electron beam 722 back towards the prism separator 750.

In addition, the second electron gun 730, positioned along the horizontal axis 712 and behind the semitransparent electron mirror 740, is biased more negatively than the semitransparent electron mirror 740 so as to generate a second electron beam (dashed line in FIG. 7) at relatively higher energy. In other words, the second, high-energy electron gun 730 may be biased at a high negative voltage of $V_2=-V_0-\Delta V$, where $\Delta V$ is larger than dV. For example, $\Delta V$ may be a few hundred volts. Since the high-energy electron gun 730 is biased more negatively than the semitransparent electron mirror 740, the second electron beam 732, collimated by one or more condenser lenses 735, passes through the semitransparent electron mirror 740 and is then transported by transfer lens 745 into the prism separator 750. Due to the energy dispersion of prism separator 750, the high-energy electron beam 732 is deflected by slightly less than 90 degrees, typically a fraction of a degree to a few degrees. In order to compensate for this, the high-energy electron beam 732 is pre-deflected by a deflection system 738, prior to entering the semitransparent electron mirror 740. In a preferred implementation, the deflection system 738 is a dual deflection system which allows the high-energy electron beam 732 to pass through the center of semitransparent electron mirror 740 which minimizes its aberrations due to the tilt angle introduced by the deflection system 738. The magnitude and direction of this pre-deflection are chosen in such a way that the high-energy beam 732 enters the prism separator 750 inclined in the dispersion plane at an angle equal to the difference in bending angles between the low-energy and high-energy beams, thus making the two beams at different energies coaxial after they emerge from the magnetic separator 750.

Thereafter, the apparatus 700 operates in a same or similar manner as the apparatuses 300 and 500 discussed above in relation to FIGS. 3 and 5. After the beam is deflected into the objective optics 760, the electrons are decelerated and focused by the objective lens. The electrons are scattered by the specimen 770, and form a two-dimensional image. The scattered electron beam 775 is then refocused by the objective lens 760 and bent by the prism separator 750 into the projection optics 780, which magnifies the image for detection and display on a viewing screen 790. The detection may be performed by a CCD camera detector or other detection system.

Figure 8:
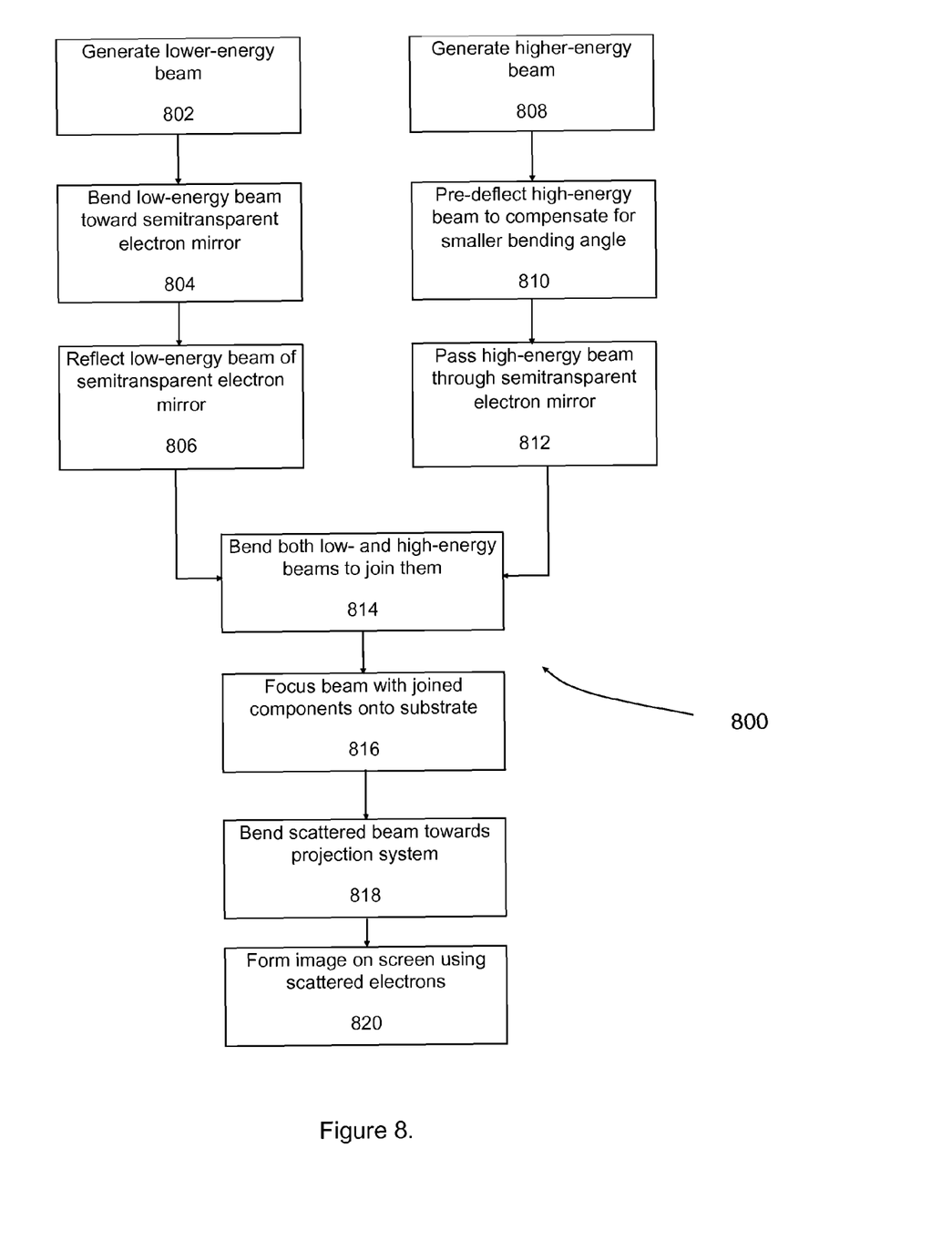
FIG. 8 is a flow chart depicting a method for imaging of a specimen using two illuminating beams in accordance with an embodiment of the invention.

FIG. 8 is a flow chart depicting a method 800 for imaging of a specimen using two illuminating electron beams in accordance with an embodiment of the invention. This method 800 may use the structure 700 described above in relation to FIG. 7.

A low-energy electron beam is generated 802 by a first electron gun. The low-energy electron beam is bent 804 by a prism separator 750 toward a semitransparent electron mirror and reflected 806 off of the semitransparent electron mirror, back towards the prism separator. A second, high-energy electron beam is generated 808 by a second (separate) electron gun and pre-deflected 810 by a deflection system, prior to entering the semitransparent electron mirror. This allows to compensate for the difference in bending angles in the prism separator due to the different beam energies of the two illuminating beams. After the pre-deflection, the high-energy electron beam is passed 812 through an opening in the semitransparent electron mirror.

The low- and high-energy components are bent 814 by the prism separator 750 and joined to form a dual electron beam. During this bending 814, dispersion is introduced between the two beam components. In other words, the two components are bent by different bending angles, due to the difference in electron energy. The difference in bending angles is equal to the deflection angle imposed by the deflection system 738 on the high-energy electron beam, thereby making the two electron beam components co-axial after exiting prism separator 750.

Thereafter, the method 800 of FIG. 8 follows the same or similar steps as the method 400 and 600 described above in relation to FIGS. 4 and 6. Using the objective lens, the dual electron beam with two joined higher and lower energy components is then focused 816 onto an area of the specimen. Impingement of the rejoined electron beam components onto the specimen area generates scattered electrons. The scattered electrons are bent 818 by the prism separator to separate them from the incoming low- and high-energy illumination electron beams. The scattered beam is deflected away from the illumination system and instead towards the projection system. The separation occurs because, within the separator, the scattered electrons have velocity vectors away from the specimen, while the incident electrons have velocity vectors towards the specimen. Finally, the scattered electron beam is used to form an image 820 of the area illuminated on the specimen.

Advantageously, the above-disclosed technique allows the use of two conventional single beam electron guns and a single prism separator to create a dual-energy beam for use in imaging and other applications. The use of a single prism separator reduces the complexity of the dual-beam column design when compared to the previous approaches. It significantly reduces the number of complex electron-optical column components, simplifies the overall column alignment, reduces column cost and improves column reliability and manufacturability.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for generating two spatially overlapping electron beams on a specimen, the apparatus comprising:
   a first electron beam source configured to generate a low-energy electron beam;
   a second electron beam source configured to generate a high-energy electron beam;
   a semitransparent electron mirror biased to reflect the low-energy electron beam and including an opening therein through which passes the high-energy electron beam;
   an energy-dispersive device configured to:
      bend the low-energy electron beam towards said electron mirror, bend both the low-energy electron beam reflected off of said electron mirror and the high-energy electron beam passing through said electron mirror towards a specimen, and bend the electron beam scattered by the specimen toward an electron detector;

a deflection system positioned between said high-energy electron source and said electron mirror and configured to deflect the high-energy electron beam by an angle that compensates for the difference in bending angles between the low- and high-energy electron beam introduced by said energy-dispersive device.

2. The apparatus of claim 1, wherein the energy-dispersive device bends the low-energy electron beam by 90 degrees during each bending step.

3. The apparatus of claim 1, wherein the energy-dispersive device is a magnetic prism composed of an array of uniform magnetic fields of different length and strength with corresponding transient magnetic fields.

4. The apparatus of claim 1, wherein the first electron source is biased at a less negative voltage than the semitransparent electron mirror mirror is biased.

5. The apparatus of claim 1, wherein the second electron source is biased at a more negative voltage than the semitransparent electron mirror is biased.

6. The apparatus of claim 1, further comprising:
a plurality of electron lenses configured to transport the low- and high-energy electron beams from the semitransparent electron mirror towards the energy-dispersive device.

7. The apparatus of claim 1, further comprising:
a plurality of electron lenses configured to direct the dual electron beam onto a two-dimensional area of a specimen being imaged.

8. The apparatus of claim 1, further comprising:
a plurality of electron lenses configured to form a two-dimensional electron image on said electron detector.

9. The apparatus of claim 8, wherein said electron detector comprises:
an electron scintillator transforming said two-dimensional electron image into a light image; and
a light optics configured to transport said light image to an image sensor.

10. A method for generating two spatially overlapping electron beams on a specimen, the method comprising:
generating a low-energy electron beam;
bending the low-energy electron beam in an energy-dispersive device towards a semitransparent electron mirror arrangement;
reflecting the low-energy electron beam by a semitransparent electron mirror arrangement;
generating a high-energy electron beam;
deflecting the high-energy electron beam by an angle that equals the difference in bending angles between the low- and high-energy electron beam introduced by said energy-dispersive device;
passing the high-energy electron beam through an opening in the semitransparent electron mirror arrangement;
bending the low- and high-energy electron beams in said energy-dispersive device towards a specimen;
generating a scattered electron beam by illuminating the specimen with the low- and high-energy electron beams; and
bending the scattered electron beam in said energy-dispersive device towards an electron detector.

11. The method of claim 10, wherein said bending by the energy-dispersive device bends the low-energy electron beam by 90 degrees during each bending step.

12. The method of claim 10, wherein the low-energy beam is reflected by the semitransparent electron mirror arrangement because of a less negative voltage bias at an electron source of the low-energy beam in comparison to a voltage bias at the semitransparent electron mirror arrangement.

13. The method of claim 12, wherein the high-energy beam passes through the opening in the semitransparent electron mirror arrangement because of a more negative voltage bias at an electron source of the high-energy beam in comparison to the voltage bias at the semitransparent electron mirror arrangement.

14. The method of claim 10, wherein said deflecting is performed in a dual deflection system with opposing deflection fields configured to minimize aberrations generated when the high-energy electron beam passes through said semitransparent electron mirror.

15. The method of claim 10, further comprising:
a plurality of electron lenses configured to direct the dual electron beam onto a two-dimensional area of a specimen being imaged.

16. The method of claim 10, wherein said plurality of electron lenses is configured to form a two-dimensional electron image on said electron detector.

17. The method of claim 16, wherein said electron detector comprises:
an electron scintillator transforming said two-dimensional electron image into a light image; and
a light optics configured to transport said light image to an image sensor.

* * * * *